United States Patent
Nishimura

(10) Patent No.: US 8,803,108 B2
(45) Date of Patent: Aug. 12, 2014

(54) METHOD FOR ACQUIRING SETTLING TIME

(71) Applicant: NuFlare Technology, Inc, Numazu (JP)

(72) Inventor: Rieko Nishimura, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 0 days.

(21) Appl. No.: 13/940,477

(22) Filed: Jul. 12, 2013

(65) Prior Publication Data
US 2014/0054469 A1 Feb. 27, 2014

(30) Foreign Application Priority Data
Aug. 23, 2012 (JP) ................................. 2012-184005

(51) Int. Cl.
*H01J 37/147* (2006.01)
*H01J 37/304* (2006.01)
*H01J 37/317* (2006.01)

(52) U.S. Cl.
CPC ........... *H01J 37/3045* (2013.01); *H01J 37/147* (2013.01); *H01J 37/3174* (2013.01)
USPC ............... 250/491.1; 250/492.22; 250/396 R; 250/397; 250/492.1

(58) Field of Classification Search
CPC . H01J 37/3174; H01J 37/147; H01J 37/3045; H01J 37/3023; G11C 27/026
USPC ........... 250/492.22, 396 R, 397, 491.1, 492.1
See application file for complete search history.

(56) References Cited

U.S. PATENT DOCUMENTS

| | | | | |
|---|---|---|---|---|
| 5,369,309 A | * | 11/1994 | Bacrania et al. ................. | 327/94 |
| 5,481,129 A | * | 1/1996 | DeJong et al. ................. | 257/360 |
| 5,757,015 A | * | 5/1998 | Takemoto et al. .......... | 250/491.1 |
| 6,242,751 B1 | * | 6/2001 | Takemoto et al. ........ | 250/492.22 |
| 6,495,841 B1 | * | 12/2002 | Ando et al. ............... | 250/492.23 |
| 7,589,335 B2 | * | 9/2009 | Matsukawa et al. ...... | 250/492.22 |
| 7,834,333 B2 | * | 11/2010 | Nishimura et al. ....... | 250/492.22 |
| 8,247,783 B2 | * | 8/2012 | Nishimura ................. | 250/396 R |
| 8,431,908 B2 | * | 4/2013 | Inoue ......................... | 250/396 R |
| 2012/0142294 A1 | * | 6/2012 | Cercelaru .................. | 455/200.1 |
| 2014/0054469 A1 | * | 2/2014 | Nishimura .................... | 250/400 |

FOREIGN PATENT DOCUMENTS

JP 2010-74039 4/2010

* cited by examiner

*Primary Examiner* — David A Vanore
(74) *Attorney, Agent, or Firm* — Oblon, Spivak, McClelland, Maier & Neustadt, L.L.P.

(57) ABSTRACT

A method for acquiring a settling time according to an embodiment, includes writing a plurality of first patterns, arranged in positions apart from each other by a deflection movement amount, by using a DAC amplifier in which a settling time of the DAC amplifier is set to a first time to be a sufficient settling time; writing a plurality of second patterns, in a manner where corresponding first and second patterns are in a position adjacent, for each second time of different second times containing the sufficient settling time set as variable; measuring a width dimension of each of a plurality of combined patterns after adjacent first and second patterns are combined for the each second time set as variable; and acquiring the settling time of the DAC amplifier needed for deflection by the deflection movement amount, using the width dimensions.

16 Claims, 9 Drawing Sheets

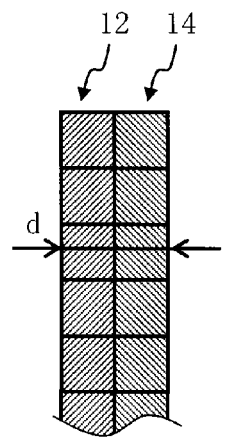
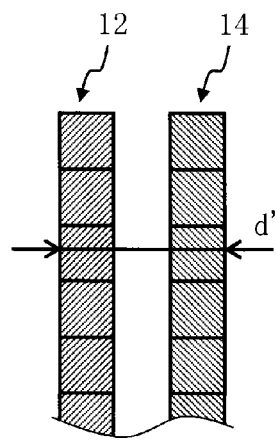
FIG. 9A    FIG. 9B
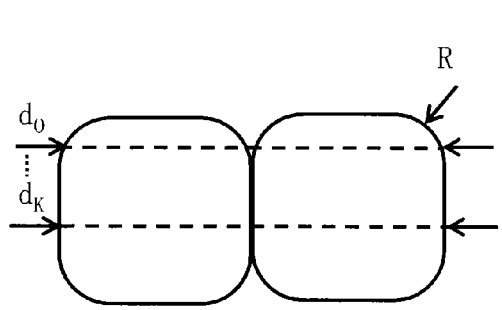
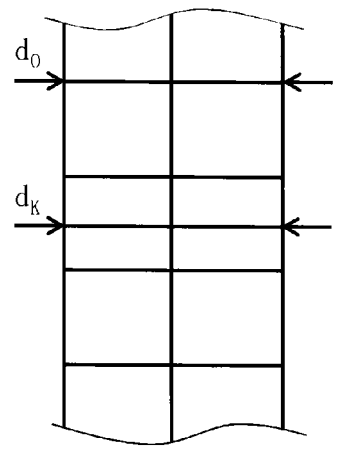
FIG. 10A
FIG. 10B

METHOD FOR ACQUIRING SETTLING TIME

CROSS-REFERENCE TO RELATED APPLICATION

This application is based upon and claims the benefit of priority from prior Japanese Patent Application No. 2012-184005 filed on Aug. 23, 2012 in Japan, the entire contents of which are incorporated herein by reference.

BACKGROUND OF THE INVENTION

1. Field of the Invention

Embodiments described herein relate generally to a method for acquiring a settling time and, for example, relates to a method for acquiring a settling time of an amplifier for deflection that deflects an electron beam of an electron beam writing apparatus.

2. Related Art

A lithography technique which leads development of micropatterning of a semiconductor device is a very important process for exclusively generating a pattern in semiconductor manufacturing processes. In recent years, with an increase in integration density of an LSI, a circuit line width required for semiconductor devices is getting smaller year by year. In order to form a desired circuit pattern on such semiconductor devices, a high-precision original pattern (also called a reticle or a mask) is needed. In this case, an electron beam (EB) pattern writing technique has an essentially excellent resolution, and is used in production of precise original patterns.

FIG. 11 is a conceptual diagram for explaining an operation of a variable-shaped electron beam writing apparatus. The variable-shaped electron beam writing apparatus operates as described below. A rectangular opening 411 to form an electron beam 330 is formed in a first aperture plate 410. A variable-shaped opening 421 to shape the electron beam 330 having passed through the opening 411 of the first aperture plate 410 into a desired rectangular shape is formed in a second aperture plate 420. The electron beam 330 irradiated from a charged particle source 430 and having passed through the opening 411 of the first aperture plate 410 is deflected by a deflector and passes through a portion of the variable-shaped opening 421 of the second aperture plate 420 before being irradiated on a target object 390 placed on a stage continuously moving in a predetermined direction (for example, an X direction). That is, a rectangular shape capable of passing through both the opening 411 of the first aperture plate 410 and the variable-shaped opening 421 of the second aperture plate 420 is written in a pattern writing region of the target object 340 placed on the stage continuously moving in the X direction. The method for forming any shape by causing a beam to pass through both the opening 411 of the first aperture plate 410 and the variable-shaped opening 421 of the second aperture plate 420 is called the variable-shaped beam method (VSB method).

In a writing apparatus, a pattern is written by deflecting a charged particle beam such as an electron beam by a deflector, and a DAC (digital/analog converter) amplifier is used for the deflection. Roles of beam deflection using such a DAC amplifier include, for example, control of the shape or size of a beam shot, control of a shot position, and blanking of a beam. To deflect a beam, it is necessary to set a settling time of a DAC amplifier needed to deflect a set amount of movement without error. If the settling time is not sufficient, an error occurs in the deflection movement amount. On the other hand, if the settling time is too long, throughput deteriorates. Thus, it is desirable to set as short a settling time as possible within a range in which no error occurs.

With development of more precise and finer circuit patterns typified by semiconductor devices in recent years, higher precision in pattern writing and improved throughput are also demanded from an electron beam writing apparatus. Thus, even slight position variations of a pattern written to a desired position on a mask by the above beam deflection affect dimensional precision for fabricating a semiconductor circuit. Thus, the above settling time needs to be optimized in the beam deflection using a DAC amplifier, particularly for control of the shot position. Conventionally, the settling time has been set, after measuring a pattern writing position using a position measuring device, in such a way that position displacements do not arise within a range measurable by the position measuring device (see Japanese Patent Application Laid-Open No. 2010-74039, for example).

However, with increasing micropatterning with higher precision in the future, the precision of calculation by the evaluation technique of the settling time described above is no longer sufficient.

BRIEF SUMMARY OF THE INVENTION

In accordance with one aspect of this invention, a method for acquiring a settling time, includes:

writing a plurality of first patterns, arranged in positions apart from each other by a deflection movement amount, by deflecting a charged particle beam onto a target object by a deflector configured to deflect the charged particle beam based on a deflection signal from a DAC (digital/analog converter) amplifier in which a settling time of the DAC amplifier is set to a first time to be a sufficient settling time for the deflection movement amount to evaluate the settling time of the DAC amplifier;

writing a plurality of second patterns, in a manner where each corresponding second pattern of the plurality of second patterns corresponding to each of the plurality of first patterns is in a position adjacent to a corresponding one of the plurality of first patterns, by deflecting a charged particle beam onto the target object respectively by the deflector for each second time of a plurality of different second times set as variable while setting the settling time of the DAC amplifier as variable using the plurality of different second times containing the sufficient settling time for the deflection movement amount;

measuring a width dimension of each of a plurality of combined patterns after adjacent ones of the plurality of first patterns and the plurality of second patterns are combined for the each second time set as variable; and acquiring the settling time of the DAC amplifier needed for deflection by the deflection movement amount, using the width dimension of each of the plurality of the combined patterns measured.

BRIEF DESCRIPTION OF THE DRAWINGS

FIGS. 9A and 9B are diagrams showing another example of arrangement conditions of a line pattern in Embodiment 1;

FIGS. 10A and 10B are diagrams showing the line pattern in Embodiment 1 and one shot figure to be a comparative example.

DETAILED DESCRIPTION OF THE INVENTION

Embodiment 1

In the following embodiment, a technique for acquiring a more suitable settling time while the precision of a shot position in a pattern to be written is maintained at a high level will be described.

In the following embodiment, a configuration using an electron beam as an example of the charged particle beam will be described. However, the charged particle beam is not limited to the electron beam, and a beam such as an ion beam using charged particles may also be used. Also, a variable-shaped writing apparatus will be described as an example of a charged particle beam apparatus.

Figure 1:
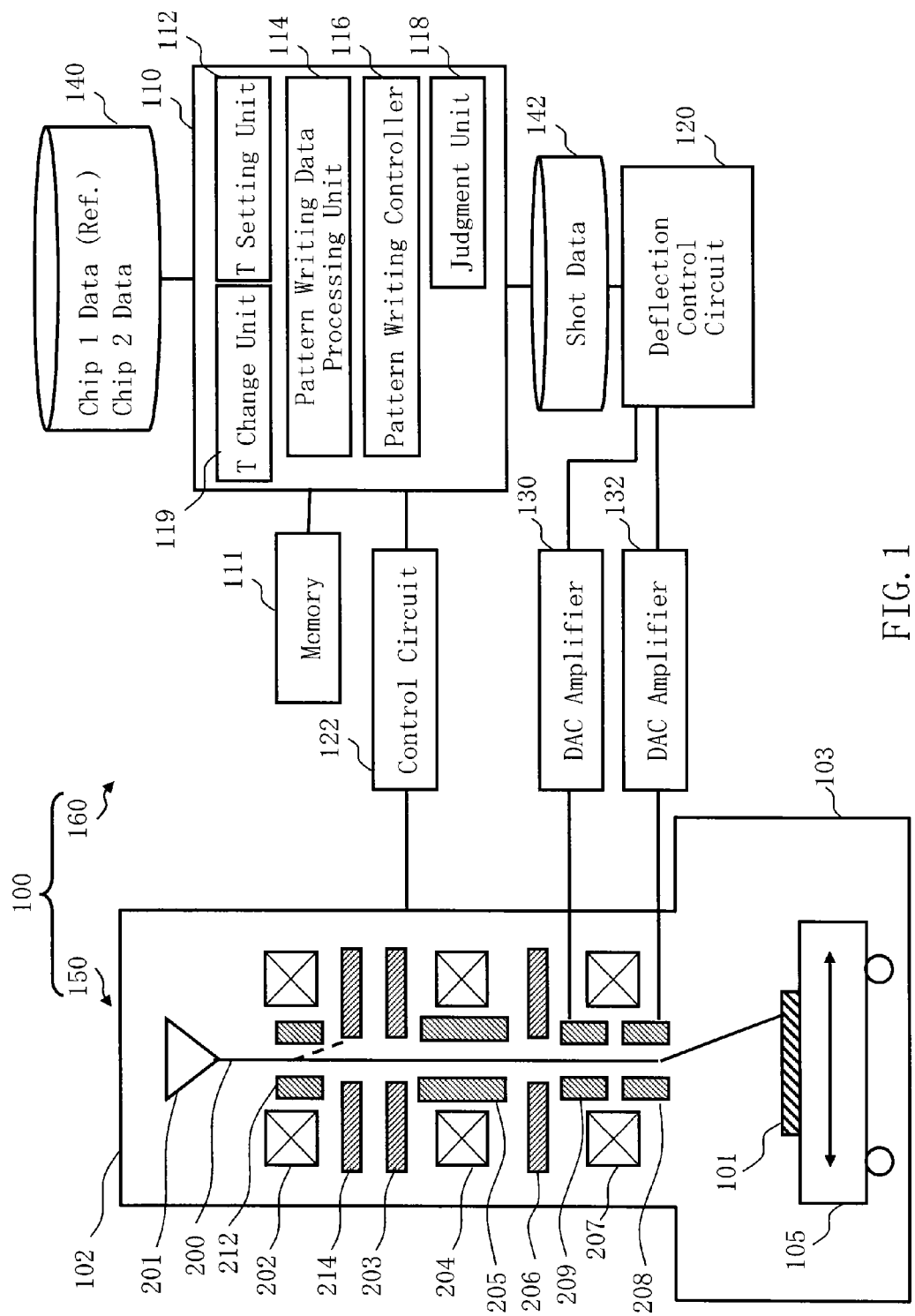
FIG. 1 is a conceptual diagram showing the configuration of a writing apparatus according to Embodiment 1.

FIG. 1 is a conceptual diagram showing the configuration of a writing apparatus according to Embodiment 1. In FIG. 1, a writing apparatus 100 includes a pattern generator 150 and a controller 160. The writing apparatus 100 is an example of the charged particle beam writing apparatus. The writing apparatus 100 is particularly an example of the variable-shaped writing apparatus. The pattern generator 150 includes an electron lens barrel 102 and a pattern writing chamber 103. In the electron lens barrel 102, an electron gun assembly 201, an illumination lens 202, a blanking deflector 212, a blanking aperture plate 214, a first aperture plate 203, a projection lens 204, a deflector 205, a second aperture plate 206, an objective lens 207, a main deflector 208, and a sub-deflector 209 are arranged. An XY stage 105 is arranged inside the pattern writing chamber 103. A target object 101, such as a mask on which a pattern should be written during pattern writing, is arranged on the XY stage 105. The target object 101 includes an exposure mask used for fabricating a semiconductor device. The target object 101 also includes mask blanks to which a resist is applied and on which no pattern is written.

The controller 160 includes a control computer 110, a memory 111, a deflection control circuit 120, a control circuit 122, DAC (digital/analog converter) amplifiers 130, 132, and storage apparatuses 140, 142 such as magnetic disk drives. The control computer 110, the memory 111, the deflection control circuit 120, the control circuit 122, and the storage apparatuses 140, 142 are connected via a bus (not shown).

A settling time setting unit 112, a pattern writing data processing unit 114, a pattern writing controller 116, a judgment unit 118, and a settling time change unit 119 are arranged in the control computer 110. The function of, for example, the settling time setting unit 112, the pattern writing data processing unit 114, the pattern writing controller 116, the judgment unit 118, and the settling time change unit 119 may be configured by hardware such as an electric circuit or by software such as a program executing these functions. Alternatively, the function may be configured by a combination of hardware and software. Information input into and/or output from the settling time setting unit 112, the pattern writing data processing unit 114, the pattern writing controller 116, the judgment unit 118, and the settling time change unit 119 and information during operation are stored in the memory 111 each time.

Here, in FIG. 1, only the configuration needed to describe Embodiment 1 is shown. The writing apparatus 100 may include other normally necessary components. For example, a multi-stage deflector with 2-stage main/sub-deflectors, namely, the main deflector 208 and the sub-deflector 209, is used for position deflection. However, a 1-stage deflector or a multi-stage deflector in three or more stages may be used for the position deflection. In addition, an input device such as a mouse or keyboard, a monitor device, or an external interface circuit may be connected to the writing apparatus 100.

Figure 2:
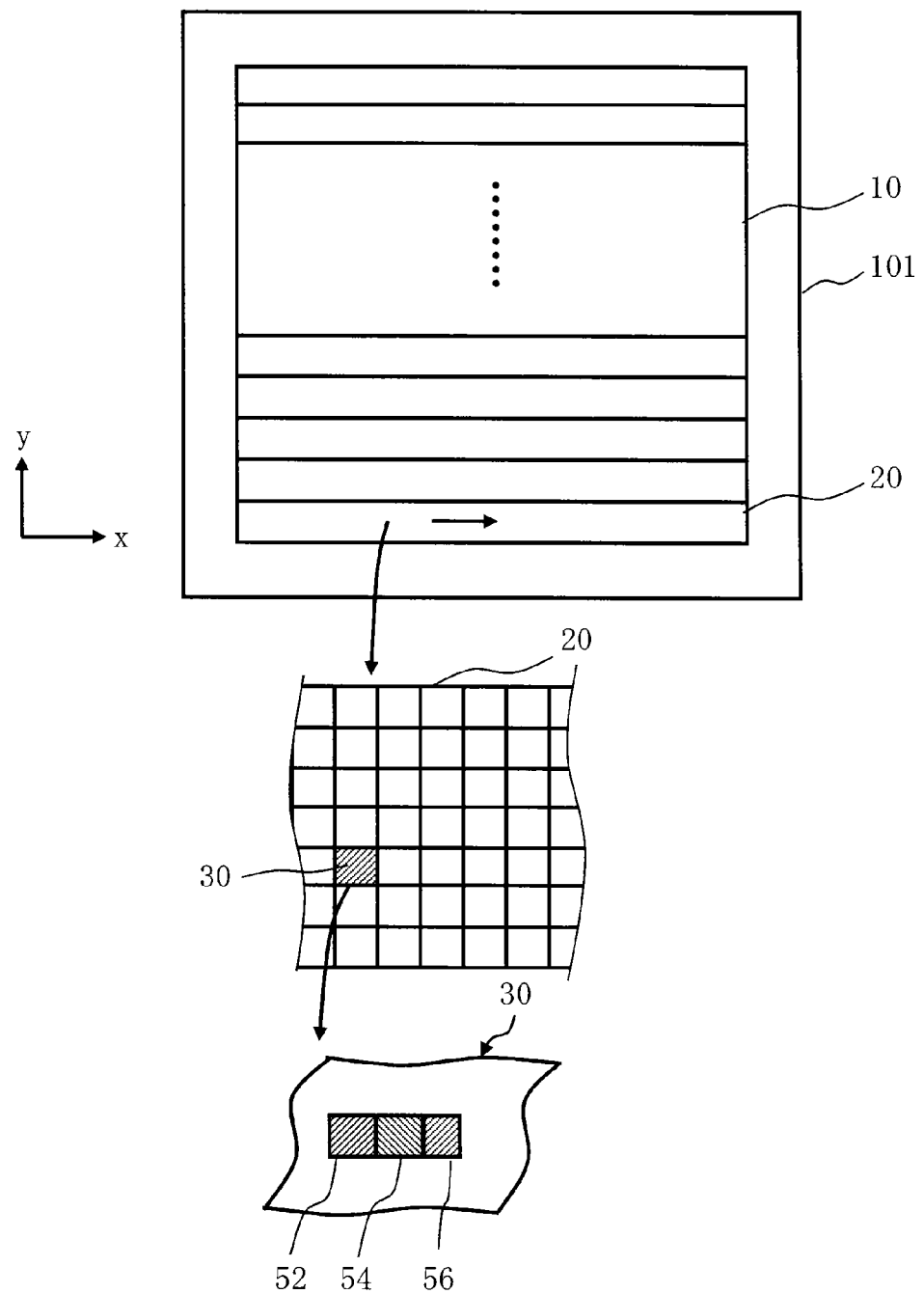
FIG. 2 is a conceptual diagram for explaining each region in Embodiment 1.

FIG. 2 is a conceptual diagram for explaining each region in Embodiment 1. In FIG. 2, a pattern writing region 10 of the target object 101 is virtually divided into a plurality of stripe regions 20 in a thin rectangular shape toward, for example, the Y direction in a width allowing deflection by the main deflector 208. Each of the stripe regions 20 is virtually divided into a plurality of sub-fields (SF) 30 (small regions) in a mesh shape in a size allowing deflection by the sub-deflector 209. Then, shot figures 52, 54, 56 are written to each shot positions of the SF 30.

A digital signal for blanking control is output from the deflection control circuit 120 to a DAC amplifier for blanking control. Then, the DAC amplifier for blanking control converts the digital signal into an analog signal and amplifies the analog signal, which is then applied to the blanking deflector 212 as a deflecting voltage. An electron beam 200 is deflected by the deflecting voltage to form a beam of each shot.

A digital signal for main deflection control is output from the deflection control circuit 120 to the DAC amplifier 132. Then, the DAC amplifier 132 converts the digital signal into an analog signal and amplifies the analog signal, which is then applied to the main deflector 208 as a deflecting voltage. The electron beam 200 is deflected by the deflecting voltage and a beam of each shot is deflected to a reference position of the predetermined sub-field (SF) 30 obtained by virtual division in a mesh shape.

A digital signal for sub-deflection control is output from the deflection control circuit 120 to the DAC amplifier 130. Then, the DAC amplifier 130 converts the digital signal into an analog signal and amplifies the analog signal, which is then applied to the sub-deflector 209 as a deflecting voltage. The electron beam 200 is deflected by the deflecting voltage, and a beam of each shot is deflected to each shot position in the predetermined sub-field (SF) obtained by virtual division in a mesh shape.

In the writing apparatus 100, pattern writing processing for each of the stripe regions 20 is performed by using deflectors in a plurality of stages. Here, as an example, deflectors in two stages including, for example, the main deflector 208 and the sub-deflector 209, are used. A pattern is written in the first stripe region 20 toward the X direction while the XY stage 105 continuously moves toward, for example, the −X direction. Then, when pattern writing in the first stripe region 20 is completed, a pattern is written in the second stripe region 20 in the same manner or toward a reverse direction. A pattern is similarly written in the third and subsequent stripe regions 20. Then, the main deflector 208 successively deflects the electron beam 200 to a reference position A of the SF 30 following the movement of the XY stage 105. In addition, the sub-deflector 209 defects the electron beam 200 from the reference position A of each of the SF 30 to each shot position of the beam irradiated into the SF 30. Thus, the main deflector 208 and the sub-deflector 209 have deflection regions that are different in size. Then, the SF 30 is the minimum deflection region among the deflection regions of the deflectors in the plurality of stages.

Embodiment 1 will be described below by focusing on the method for acquiring the optimal settling time to be set to the DAC amplifier 130 for the sub-deflector 209 that deflects the electron beam 200 to each shot position in the SF 30 to be the minimum deflection region.

Figure 3:
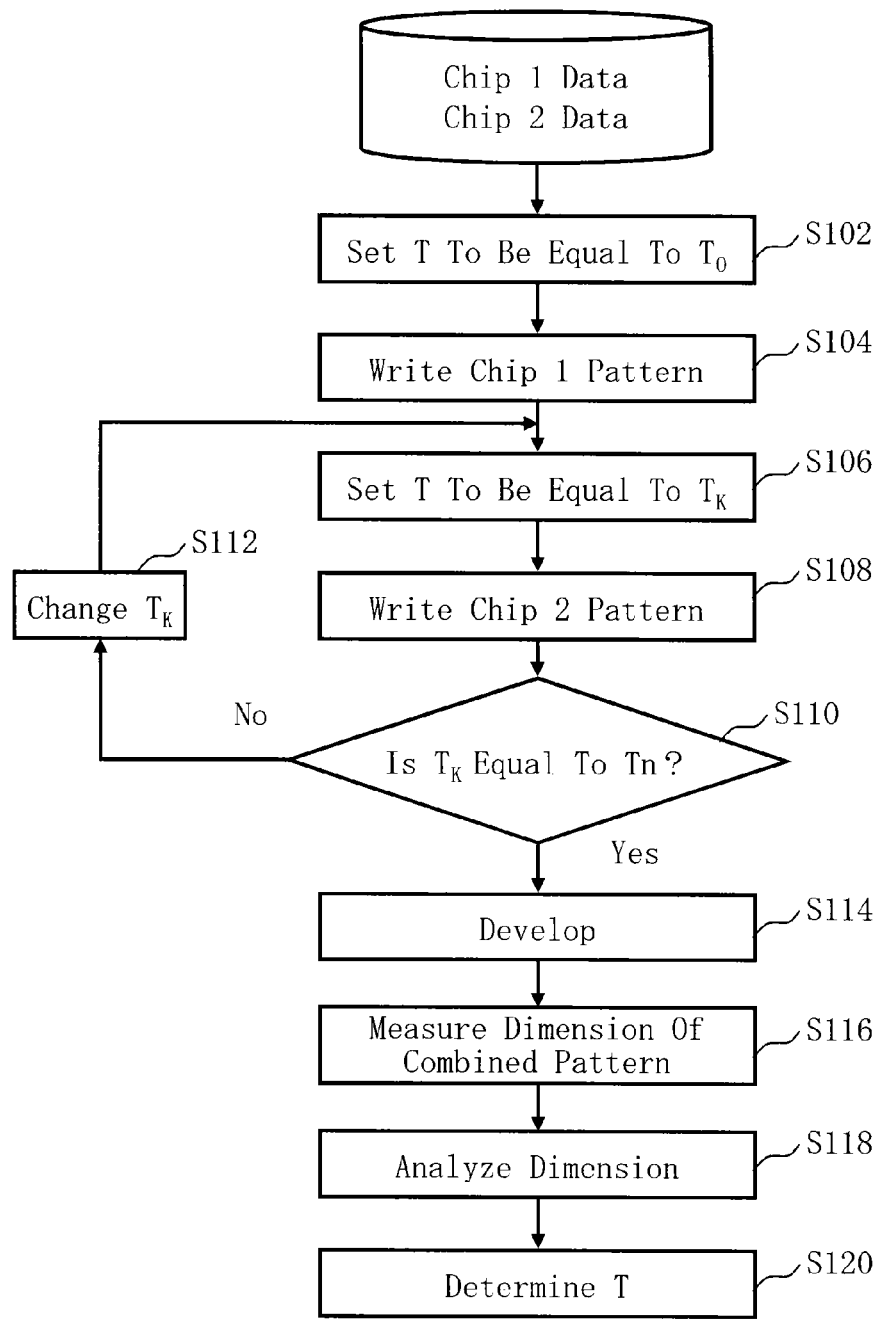
FIG. 3 is a flow chart showing principal processes of a method for acquiring a settling time of a DAC amplifier according to Embodiment 1.

FIG. 3 is a flow chart showing principal processes of a method for acquiring a settling time of a DAC amplifier according to Embodiment 1. In FIG. 3, the method for acquiring the settling time of a DAC amplifier according to Embodiment 1 executes a series of processes including a settling time setting process (S102), a chip 1 writing process (S104), a settling time setting process (S106), a chip 2 writing process (S108), a judgment process (S110), a settling time change process (S112), a development process (S114), a combined pattern dimension measuring process (S116), a dimension analysis process (S118), and a settling time determination process (S120).

As the settling time setting process (S102), the settling time setting unit 112 sets a settling time $T_0$ that is sufficiently longer than an appropriate settling time T of the DAC amplifier 130 in accordance with a movement amount (evaluated movement amount) deflected by the sub-deflector 209. The larger the deflected movement amount is, the longer settling time T of the DAC amplifier 130 is needed. Thus, the settling time T needed for the DAC amplifier 130 is a different value depending on the movement amount. The settling time T of the DAC amplifier 130 longer than necessary can be used without causing any deflection position error. Meanwhile, if the settling time is too long, it takes longer to perform one operation of deflection. Thus, throughput of the writing apparatus 100 deteriorates. Therefore, it is desirable to acquire the appropriate settling time T of the order of magnitude that is not too long and does not cause a deflection position error. In Embodiment 1, the time $T_0$ sufficiently longer than the time anticipated as the appropriate settling time T is set to obtain the appropriate settling time T in accordance with the movement amount to be acquired and closer to the optimal time.

As the chip 1 writing process (S104), the writing apparatus 100 writes a pattern of a chip 1 by deflecting the electron beam 200 onto the target object 101 by the sub-deflector 209 using the DAC amplifier 130 whose settling time is set to the time $T_0$ (first time) which is a sufficiently longer settling time (sufficient settling time) than the settling time T anticipated for a deflection movement amount to evaluate the settling time of the DAC amplifier 130. Pattern data of the chip 1 is input from outside and stored in the storage apparatus 140.

Figure 4:
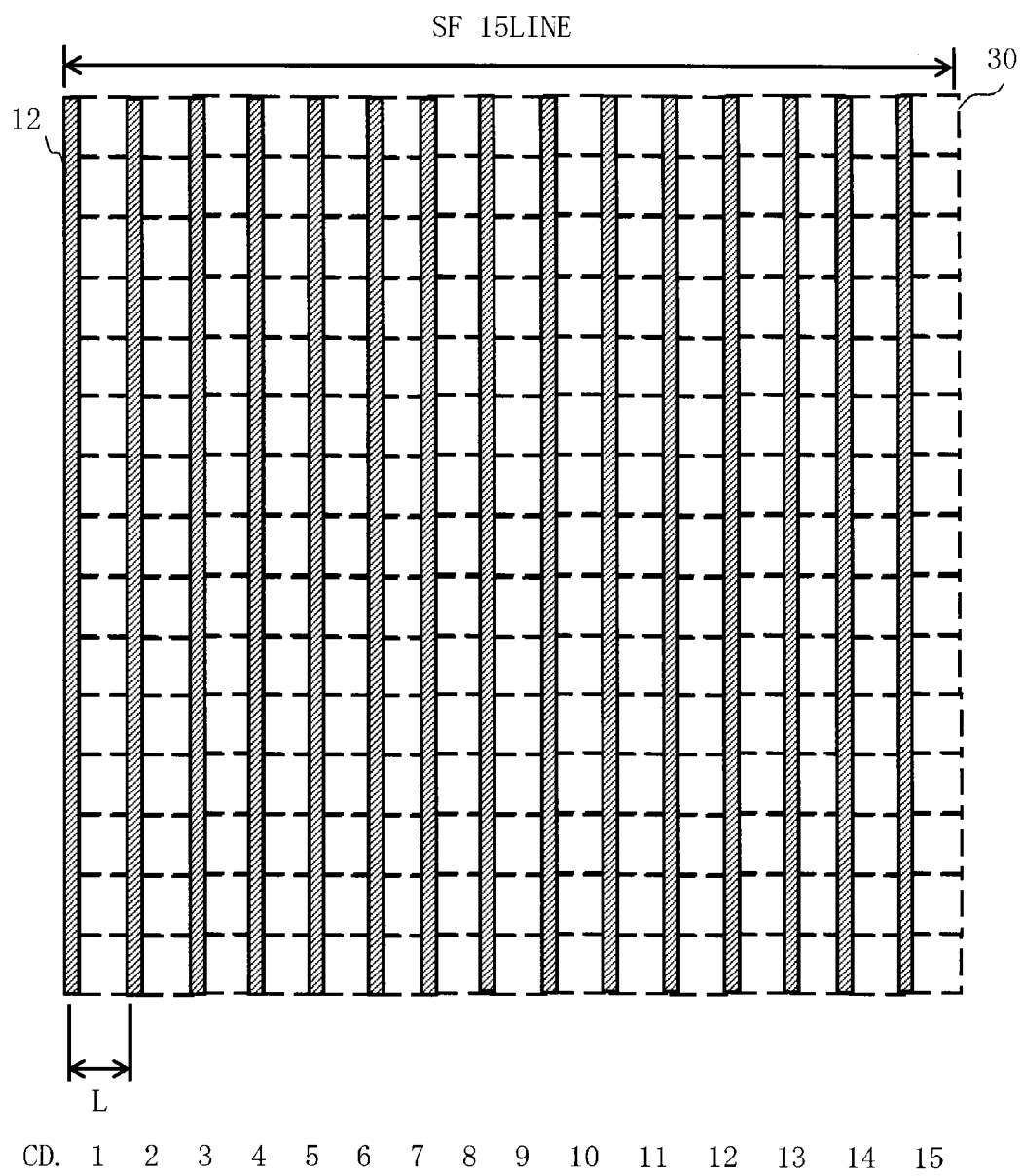
FIG. 4 is a diagram showing an example of a chip pattern of a reference chip according to Embodiment 1.

FIG. 4 is a diagram showing an example of a chip pattern of a reference chip according to Embodiment 1. In FIG. 4, the chip pattern (reference pattern) of the chip 1 as the reference chip is formed of a plurality of line patterns 12 arranged in parallel. The plurality of line patterns 12 is arranged in such a way that the line patterns are arranged in positions apart from each other by a movement amount L (deflection movement amount) to be deflected by the sub-deflector 209. In Embodiment 1, the settling time of the DAC amplifier 130 in accordance with the movement amount L to be deflected by, for example, the sub-deflector 209 is determined and thus, the plurality of line patterns 12 is arranged in the SF 30 as a deflectable region of the sub-deflector 209. In the example of FIG. 4, for example, 15 line patterns are arranged in positions apart from each other by the movement amount L in the SF 30.

Because, as will be described later, the chip pattern of the chip 1 will be combined with a chip pattern of a chip 2 in every settling time set as variable, in other words, the dimension between the respective outer edges of the chip pattern of the chip 1 and the chip pattern of the chip 2 is the dimension to be evaluated and thus, it is advantageous that the chip pattern of the chip 1 is written to a plurality of the SF 30 for each time.

To write the chip pattern of the chip 1, the writing apparatus 100 operates as described below. First, the pattern writing data processing unit 114 reads pattern data (pattern writing data 1) of the chip 1 from the storage apparatus 140, and performs data conversion processing in a plurality of stages to generate shot data specific to the apparatus. In the pattern data of the chip 1, the plurality of line patterns 12 shown in FIG. 4 is defined. However, to write a figure pattern by the writing apparatus 100, it is necessary to divide the plurality of line patterns 12 as a figure pattern defined as the pattern data of the chip 1 into sizes that can be irradiated by one beam shot. Thus, to actually write a pattern, the pattern writing data processing unit 114 divides each figure pattern into sizes that can be irradiated by one beam shot to generate shot figures. Then, shot data is generated for each shot figure. In the shot data, for example, figure data such as the figure type, figure size, and irradiation position is defined. In addition, the beam irradiation time in accordance with the dose is defined. The generated shot data is stored in the storage apparatus 142. In this case, each of the line patterns 12 will be divided into a plurality of rectangular shot figures.

Next, the pattern writing controller 116 controls the deflection control circuit 120 and the control circuit 122 to output a control signal so that pattern writing processing of shot data corresponding to the chip pattern of the chip 1 is performed. The deflection control circuit 120 reads shot data from the storage apparatus 142 to generate main deflection data and sub-deflection data for each shot figure in accordance with irradiation position data defined in the shot data. The main deflection data is output to the DAC amplifier 132. The sub-deflection data is output to the DAC amplifier 130. At this point, the control signal is output to the DAC amplifier 130 so that the settling time T of the DAC amplifier 130 is equal to the sufficiently long time $T_0$ described above. The deflection control circuit 120 generates blanking data for each shot figure in accordance with the beam irradiation time defined in the shot data, and outputs the blanking data to a DAC amplifier for blanking (not shown). The deflection control circuit 120 also generates shaping data in accordance with the figure type and figure size defined in the shot data, and outputs the shaping data to a DAC amplifier for beam shaping. Then, based on signals from each DAC amplifier controlled by the control circuit 122 and the deflection control circuit 120, the pattern generator 150 writes the figure pattern to the target object 101 by using the electron beam 200. A more specific operation is as described below.

The electron beam 200 emitted from the electron gun assembly 201 (discharge unit) is controlled by the blanking deflector 212, that is controlled by a deflection signal from the DAC amplifier for blanking, to pass through the blanking aperture plate 214 when passing through the blanking deflector 212 in a beam ON state, and the whole beam is deflected so as to be shielded by the blanking aperture plate 214 in a beam OFF state. The electron beam 200 having passed through the blanking aperture plate 214 between the transition from the beam OFF state to the beam ON state and the subsequent transition to the beam OFF state is considered as one shot of the electron beam. The blanking deflector 212 generates the beam ON state and the beam OFF state alternately by controlling the orientation of the passing electron beam 200. The alternate generation may be simply achieved by, for example, applying no voltage for the beam ON state and applying a voltage to the blanking deflector 212 for the beam OFF state. The dose per shot of the electron beam 200 irradiated on the target object 101 is adjusted by the beam irradiation time t of each shot.

The electron beam 200 of each shot generated by passing through the blanking deflector 212 and the blanking aperture plate 214 as described above illuminates the entirety of the first shaping aperture plate 203 having a rectangular hole through the illumination lens 202. Here, the electron beam 200 is first shaped into a rectangular shape. Then, the electron beam 200 of a first aperture image having passed through the first shaping aperture plate 203 is projected on the second shaping aperture plate 206 by the projection lens 204. The first aperture image on the second shaping aperture plate 206 is controlled to deflect by the deflector 205 so that the beam shape and dimensions can be changed (variably shaped). Such variable shaping is done for each shot and each shot normally shapes a different beam shape with different dimensions. In this case, however, line patterns are divided and shot figures frequently have the same shape. Then, the electron beam 200 of a second aperture image having passed through the second shaping aperture plate 206 is focused by the objective lens 207 and deflected by the main deflector 208 and the sub-deflector 209 before being irradiated on a desired position of the target object 101 arranged on the XY stage 105 moving continuously. In FIG. 1, a case in which a multi-stage deflector with the 2-stage main/sub-deflectors is used for position deflection is shown. In such a case, the electron beam 200 of the shot may be deflected to the reference position of the SF 30 by the main deflector 208 while following the stage movement. The beam of the shot may be then deflected to each irradiation position in the SF by the sub-deflector 209. By repeating such operations and combining the shot figure of each shot, the plurality of line patterns shown in FIG. 4 and apart from each other by the movement amount L is written.

As the settling time setting process (S106), the settling time setting unit 112 sets the settling time T to one of the sufficiently long time $T_0$ described above and times Tk including a plurality of different times shorter than the sufficiently long time $T_0$. For example, the times Tk with k=0, 1, 2, . . . , n are prepared in advance. Then, the settling time T is first set to $T=T_0$. $T_0$ is a time sufficiently longer than the above appropriate settling time. $T_1$ is a time shorter than $T_0$. $T_2$ is a time shorter than $T_1$ . . . . $T_n$ is a time shorter than $T_{n-1}$. Thus, times are set in descending order. However, the arrangement method is not limited to the above order and any method may be applied to arrange each time indicated by $T_1$ to $T_n$ as far as values are different from each other. $T=T_0$ is first set here, but the setting is not limited to such an example and may begin with any time from $T_0$ to $T_n$ as far as a pattern can be written to the chip 2 at each time from $T_0$ to $T_n$. As will be described later, the pattern dimension of the chip 2 written when the time Tk equals to $T_0$ is combined with the pattern dimension of the chip 1 written originally when the time is $T_0$, and the combined dimension becomes the reference dimension when the width dimension is evaluated. Incidentally, $T_0$ for the chip 2 may be a different time from $T_0$ for the chip 1.

As the chip 2 writing process (S108), the writing apparatus 100 writes a chip pattern (a plurality of second patterns) of the chip 2 in such a way that line patterns thereof are arranged in positions apart from each other by the movement amount L and the each corresponding pattern corresponding to each of the plurality of line patterns 12 (a plurality of first patterns) of the chip 1 is in a position adjacent to a corresponding one of the plurality of line patterns 12, by deflecting the electron beam 200 onto the target object 101 respectively by the sub-deflector 209 for each time Tk set as variable, while setting the settling time of the DAC amplifier 130 as variable by using the plurality of different times Tk (second times) including the time $T_0$. Pattern data of the chip 2 is input from outside and stored in the storage apparatus 140.

Figure 5:
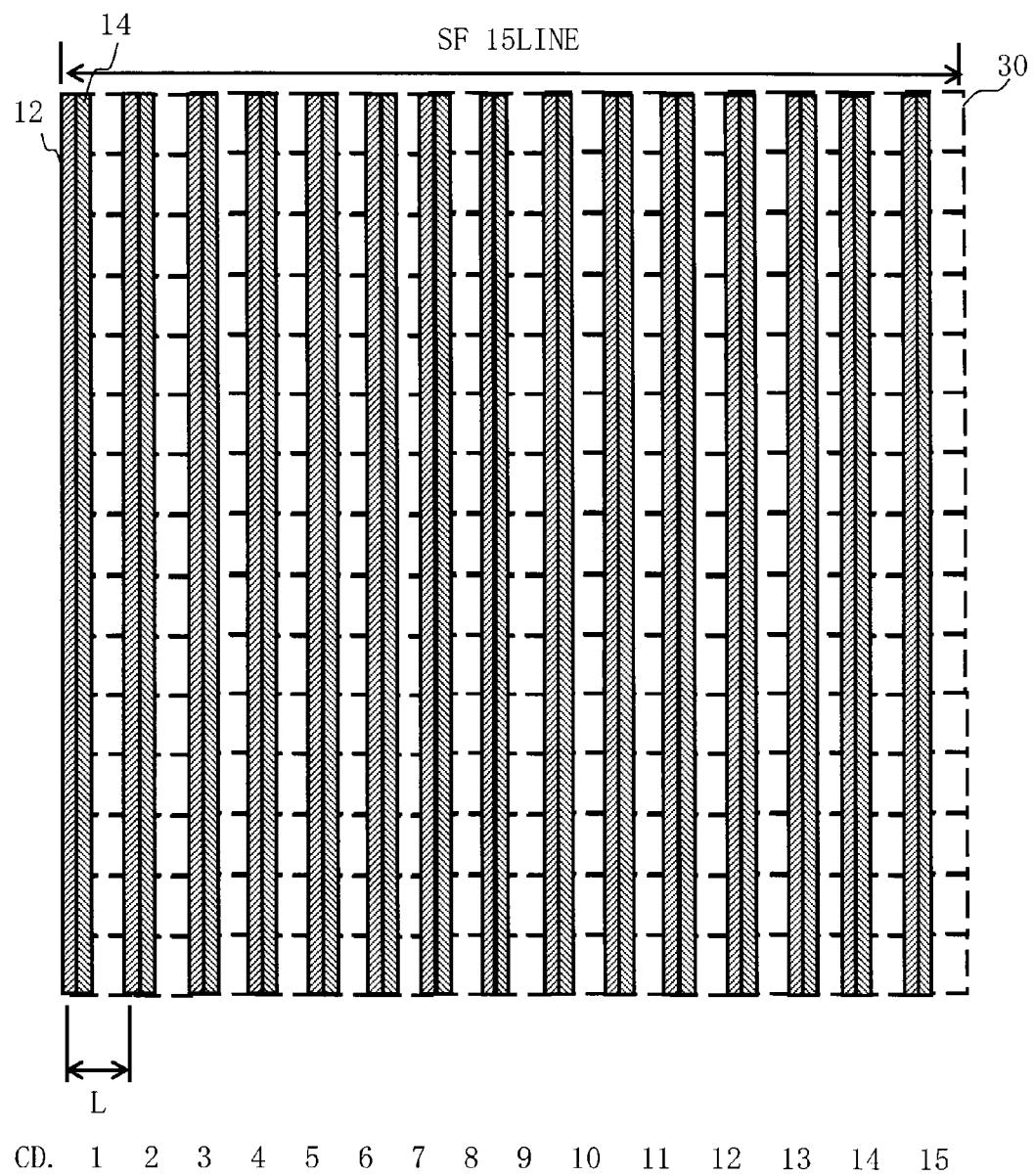
FIG. 5 is a diagram showing an example of the chip pattern of a chip 2 according to Embodiment 1.

FIG. 5 is a diagram showing an example of the chip pattern of a chip 2 according to Embodiment 1. In FIG. 5, the chip pattern of the chip 2 is formed of a plurality of line patterns 14 arranged in parallel to be adjacent to each line pattern of the chip 1. The plurality of line patterns 14 is arranged by being apart from each other by the movement amount L (deflection movement amount) to be deflected by the sub-deflector 209. In Embodiment 1, the settling time of the DAC amplifier 130 in accordance with the movement amount L to be deflected by, for example, the sub-deflector 209 is determined and thus, the plurality of line patterns 14 is arranged in the SF 30 as a deflectable region of the sub-deflector 209. In the example of FIG. 5, for example, 15 line patterns are arranged in positions apart from each other by the movement amount L in the SF 30. Also in the example of FIG. 5, the plurality of line patterns of the chip 2 is arranged in such a way that the corresponding line pattern of the chip 2 is adjacent to each line pattern of the chip 1.

To write the chip pattern of the chip 2, the writing apparatus 100 operates as described below. First, the pattern writing data processing unit 114 reads pattern data (pattern writing data 2) of the chip 2 from the storage apparatus 140, and performs data conversion processing in a plurality of stages to generate shot data specific to the apparatus. In the pattern data of the chip 2, the plurality of line patterns 14 shown in FIG. 5 is defined. Then, similar to the pattern of the chip 1, shot data is generated for each shot figure. The generated shot data of the chip 2 is stored in the storage apparatus 142. In this case, each of the line patterns 14 will be divided into, for example, a plurality of rectangular shot figures.

Next, the pattern writing controller 116 controls the deflection control circuit 120 and the control circuit 122 to output a control signal so that pattern writing processing of shot data corresponding to the chip pattern of the chip 2 is performed. The deflection control circuit 120 reads shot data of the chip 2 from the storage apparatus 142 to generate main deflection data and sub-deflection data for each shot figure in accordance with irradiation position data defined in the shot data of the chip 2. The main deflection data is output to the DAC amplifier 132. The sub-deflection data is output to the DAC amplifier 130. At this point, the control signal is output to the DAC amplifier 130 so that the settling time T of the DAC amplifier 130 is equal to the sufficiently long time $T_0$ described above. The deflection control circuit 120 generates blanking data for each shot figure in accordance with the beam irradiation time defined in the shot data, and outputs the blanking data to a DAC amplifier for blanking (not shown). The deflection control circuit 120 also generates shaping data in accordance with the figure type and figure size defined in the shot data, and outputs the shaping data to a DAC amplifier for beam shaping (not shown). Then, based on signals from each DAC amplifier controlled by the control circuit 122 and the deflection control circuit 120, the pattern generator 150 writes the figure pattern to the target object 101 by using the electron beam 200. The subsequent pattern writing operation is the same as when writing a pattern to the chip 1. By the above pattern writing processing, as shown in FIG. 5, line patterns of the chip 1 and line patterns of the chip 2 are arranged side by side to be adjacent to each other.

As the judgment process (S110), the judgment unit 118 judges whether the set time Tk is Tk=Tn. If the set time Tk is not Tk=Tn, the processing proceeds to the settling time change process (S112). If the set time Tk is Tk=Tn, the processing proceeds to the development process (S114).

As the settling time change process (S112), the settling time change unit 119 changes the value of Tk currently set thereto. For example, $T=T_0$ is changed to $T=T_1$. Then, the processing returns to the settling time setting process (S106). Then, the settling time setting process (S106) to the settling time change process (S112) are repeated until Tk=Tn holds. Because the chip pattern of the chip 1 has been written to a plurality of the SF 30, when the chip pattern of the chip 2 is written, the SF 30 to which the chip pattern of the chip 2 is written is changed each time the settling time T is varied. Accordingly, as shown in FIG. 5, a pattern in which a line pattern of the plurality of line patterns 12 of the chip 1 and a corresponding line pattern of the plurality of line patterns 14 of the chip 2 are adjacent to each other can be formed each time the settling time T is varied to write the chip pattern of the chip 2.

The different SF 30 is used each time the settling time T is varied, but the present embodiment is not limited to such an example. Each time the settling time T is varied, the target object 101 itself may be changed to write the plurality of line patterns 12 of the chip 1 and the plurality of line patterns 14 of the chip 2. Alternatively, the settling time Tk may be changed for each of the line patterns 14 written next to the plurality of line patterns 12 in one SF 30. In other words, the plurality of line patterns 12 is written into the same SF 30 of the plurality of SFs 30 and the plurality of line patterns 14 into the same SF 30. In addition, the settling time Tk for each unit of the stripe 20 may be varied. In other words, the plurality of line patterns 12 is each written into the different stripes 20 (stripe regions) and the plurality of line patterns 14 is each written into the different stripes 20 in every settling time Tk (second times) set as variable. Further, the patterns 12 and 14 may be created as a specific region larger than the SF 30 regardless of the stripe 20 and the SF 30 to change the settling time Tk for each such region.

As the development process (S114), the target object 101 on which the plurality of line patterns 12 of the chip 1 and the plurality of line patterns 14 of the chip 2 have been written is developed to form a resist pattern for each varied settling time Tk.

As the combined pattern dimension measuring process (S116), the width dimension of each of a plurality of combined patterns obtained by combining the line patterns of the chip 1 and the line patterns of the chip 2 adjacent to each other is measured for each settling time Tk set as variable by using a dimension measuring device. In other words, the dimension between outer edges, or edges which are not facing each other, of a chip pattern of the chip 1 and a chip pattern of the chip 2 adjacent to each other is measured in every settling time Tk set as variable. In this case, as an example, the width of a resist pattern is measured, but the width measurement is not limited to such an example. Another lower film (for example, a chromium (Cr) film) may be formed below the resist film of the target object 101 before performing etching by using a resist pattern as a mask. Then, the width dimension of a plurality of combined patterns after combining line patterns of the chip 1 and line patterns of the chip 2 by the lower film may be measured.

As the dimension analysis process (S118), the width dimension of each combined pattern measured in every settling time Tk set as variable.

Figures 6A, 6B:
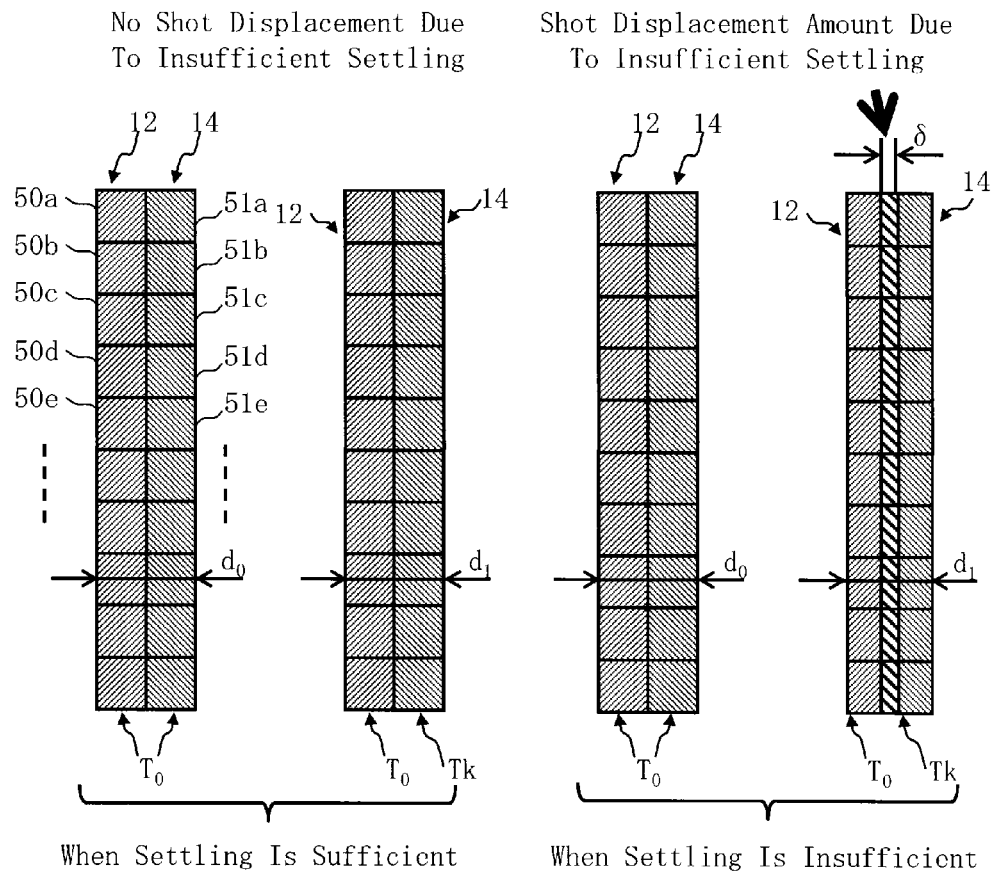
FIGS. 6A and 6B are diagrams showing examples of a width dimension of a combined pattern when the settling time is sufficient and insufficient in Embodiment 1.

FIGS. 6A and 6B are diagrams showing examples of a width dimension of a combined pattern when the settling time is sufficient and insufficient in Embodiment 1. FIG. 6A shows a case in which a pattern is written when the settling time is sufficient for both of the line patterns 12 and the line patterns 14. The line pattern 12 is formed by, as described above, linking a plurality of shot figures 50 (a, b, . . . ). The line pattern 14 is similarly formed by linking a plurality of shot figures 51 (a, b, . . . ). If the settling time is sufficient, as shown in FIG. 6A, a width dimension $d_1$ combining the line pattern 12 written in the settling time $T_0$ and the line pattern 14 written in the settling time Tk matches a width dimension $d_0$ combining the line pattern 12 and the line pattern 14 written both in the sufficient settling time $T_0$. On the other hand, if the settling time is not sufficient, as shown in FIG. 6B, the width dimension $d_1$ combining the line pattern 12 written in the settling time $T_0$ and the line pattern 14 written in the settling time Tk mismatches the width dimension $d_0$ combining the line pattern 12 and the line pattern 14 written both in the sufficient settling time $T_0$. For example, the width dimension $d_1$ is narrower than the width dimension $d_0$. In some cases, the width dimension $d_1$ could be wider. Thus, if the settling time is insufficient, an error $\delta$ between the width dimension $d_1$ and the width dimension $d_0$ arises. The dimension measuring device measures the dimension between outer edges of the two line patterns 12, 14.

Figure 7:
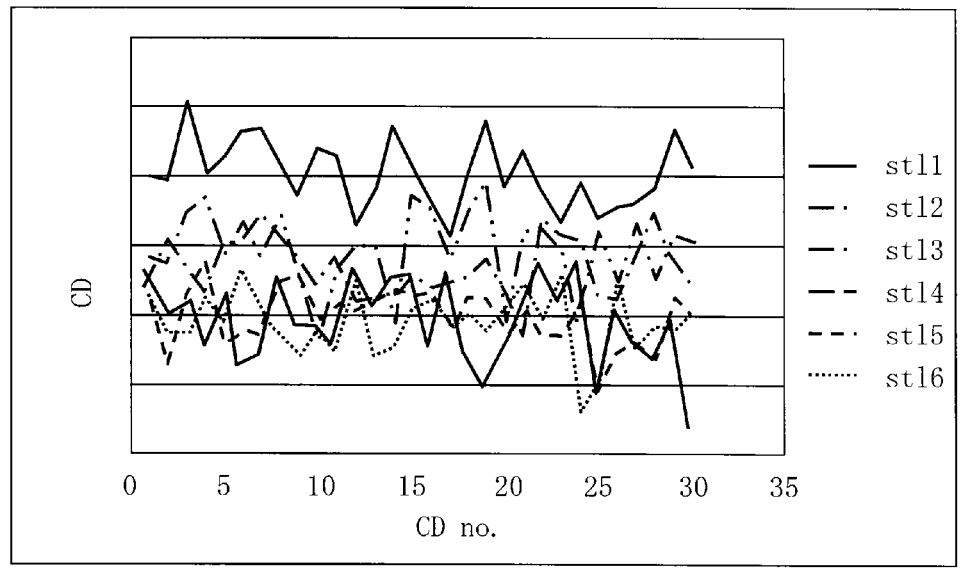
FIG. 7 is a diagram showing an example of results from measurement of the width dimension of the combined pattern in every variable settling time in Embodiment 1.

FIG. 7 is a diagram showing an example of results from measurement of the width dimension of the combined pattern in every variable settling time in Embodiment 1. FIG. 7 shows results when six types (stl1 to stl6) of the settling time are allocated. stl1 to stl6 are set in ascending order. The vertical axis represents the width dimension CD. The horizontal axis represents the position of measurement. For the position of measurement, as shown in FIG. 5, a number (CD number) is attached to each line pattern written into the SF 30 and the width dimension is measured for each number.

As the settling time determination process (S120), the time Tk set as variable in which a combined pattern whose width dimension falls within an allowable error range of the width dimension of a combined pattern of the line pattern 12 and the line pattern 14 deflected both in the sufficient time $T_0$ for a deflection movement amount is acquired as the settling time T. Then, the time Tk is determined as the settling time T.

Figure 8:
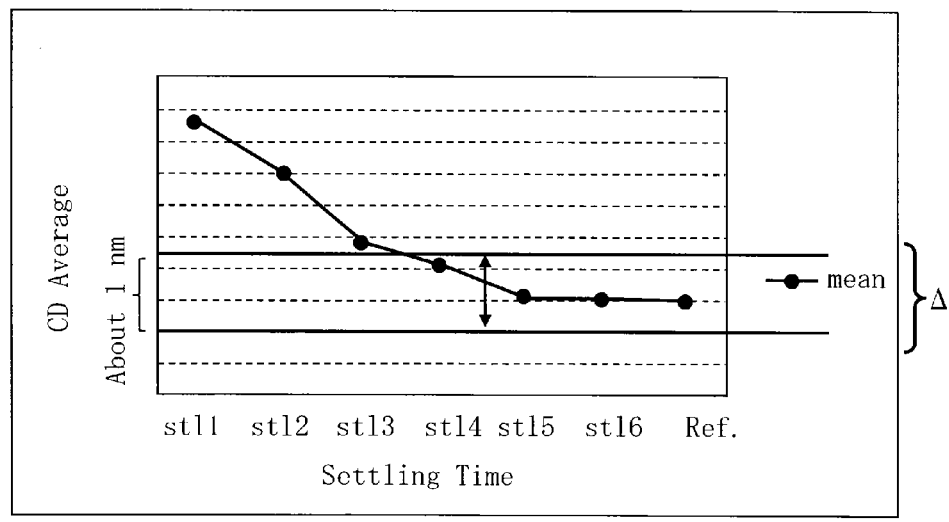
FIG. 8 is a diagram showing an example of results from measurement of an average width dimension in every variable settling time in Embodiment 1.
Figure 11:
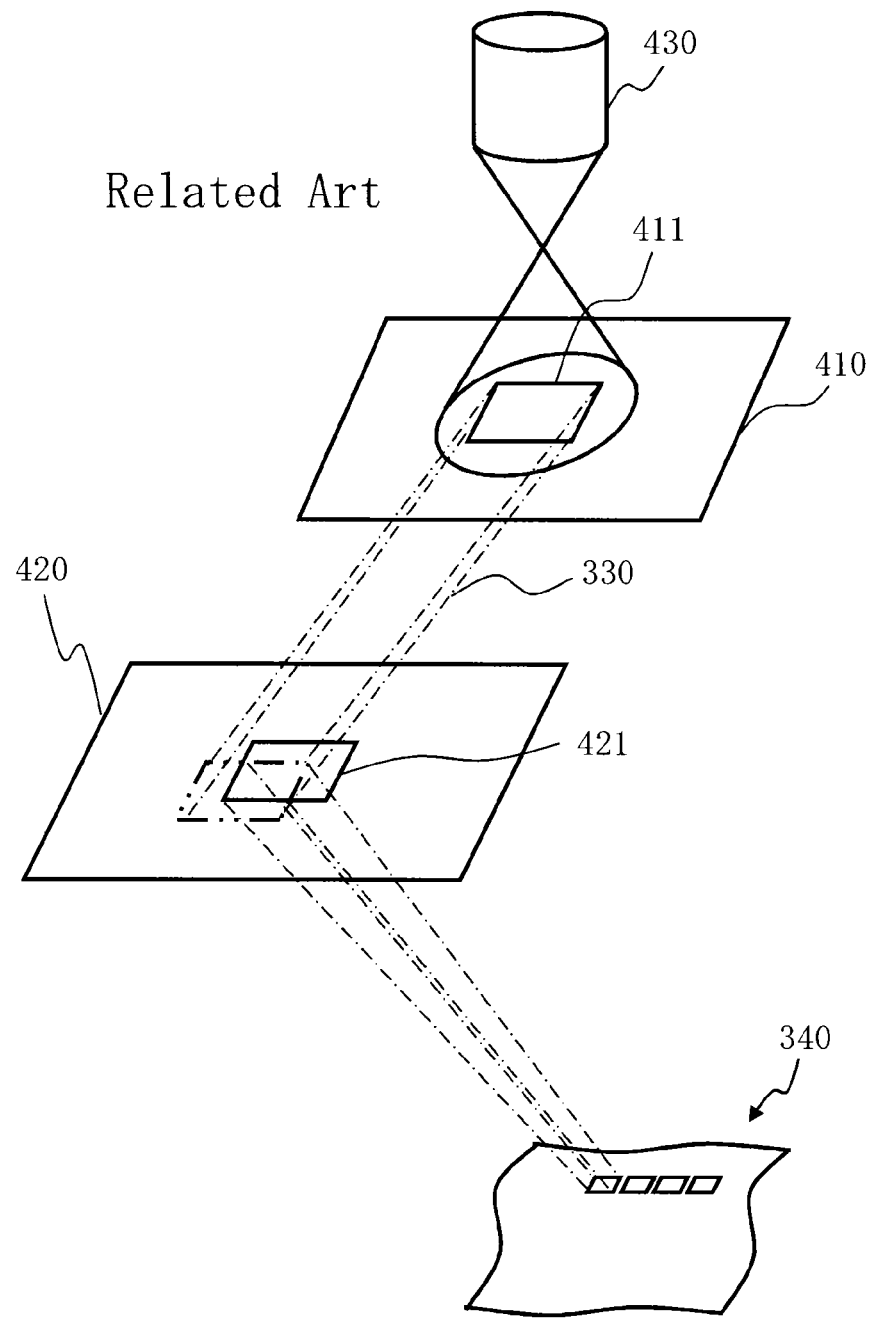
FIG. 11 is a conceptual diagram for explaining an operation of a variable-shaped electron beam writing apparatus.

FIG. 8 is a diagram showing an example of results from measurement of an average width dimension in every variable settling time in Embodiment 1. In FIG. 8, an average value of a plurality of width dimensions measured at a plurality of positions of measurement is calculated in every variable settling time and shown as a graph. The vertical axis represents the average width dimension. The horizontal axis represents the variable settling time. In FIG. 8, the maximum value and the minimum value of the width dimension $d_0$ in each position of measurement of a combined pattern of the line pattern 12 and the line pattern 14 written both in the sufficient settling time $T_0$ are shown as horizontal lines, and the range therebetween is shown as an error $\Delta$ range. Thus, if the average width dimension of a settling time of the plurality of variable settling times falls within the error $\Delta$ range, the settling time can be regarded as an available settling time.

By measuring the width dimension of a combined pattern of two line patterns written while setting the settling time of only one line pattern variable by a dimension measuring device as described above, an appropriate settling time can be found from measured values thereof. The dimension measuring device generally has higher precision than a position measuring device. When the limit of measurement by the position measuring device is, for example, 0.5 nm, the limit of measurement by the dimension measuring device is 0.25 nm. Thus, the settling time can be determined with higher precision when measured by the dimension measuring device.

FIGS. 9A and 9B are diagrams showing another example of arrangement conditions of a line pattern in Embodiment 1. Embodiment 1 is not limited to a case in which, as shown in FIG. 9A, the line pattern 12 and the line pattern 14 are adjoined so as to be just in contact with each other. As shown in FIG. 9B, there may be a space between the line pattern 12 and the line pattern 14. What is necessary is that a width dimension d' combining the line pattern 12 and the line pattern 14 is within a range that can be measured by the dimension measuring device.

FIGS. 10A and 10B are diagrams showing the line pattern in Embodiment 1 and one shot figure to be a comparative example. When a rectangular shot figure is written, as shown in FIG. 10A, four corners of the rectangle are rounded (resulting in R surfaces). When measuring the width dimension, the dimension measuring device measures the edges to be measured at a plurality of locations to calculate an average value thereof. Thus, if the width dimension of a rectangle with round corners is measured, the precision thereof is not so good. In Embodiment 1, by contrast, as shown in FIG. 10B, shot figures are intentionally connected to form a line pattern. Accordingly, most of the formed line pattern is linear and even if the edges are measured at a plurality of locations to calculate an average value thereof, the error of such a value is small. Thus, the dimension can be measured with higher precision than when one shot figure is used for evaluation. As a result, the settling time can be determined with higher precision. However, if one shot figure is sufficiently larger than a region of measurement of a measuring device, the settling time can be determined with similar calculation precision even in a case using one shot figure.

According to Embodiment 1, as described above, a more suitable settling time can be acquired while the precision of the shot position in a pattern to be written is maintained at a high level. As a result, a pattern can be written with high precision without decreasing throughput by setting the settling time acquired as described above to the DAC amplifier 130 for a deflection movement amount L.

In the foregoing, the embodiment has been described with reference to concrete examples. However, the present invention is not limited to such concrete examples.

Some parts of the configuration of the apparatus, the control method, and the like, which are not needed to be explained directly for the explanation of the present invention, are not described herein. However, a necessary configuration of the apparatus and a necessary control method can be appropriately selected and used. For example, configuration of a control unit which controls the writing apparatus 100 is not described herein. However, a necessary configuration of the control unit may be appropriately selected and used, as a matter of course.

In addition, all charged particle beam writing apparatuses and pattern writing methods which include the elements of the present invention and can be attained by appropriately changing in design by a person skilled in the art are included in the spirit and scope of the invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for acquiring a settling time, comprising:
writing a plurality of first patterns, arranged in positions apart from each other by a deflection movement amount, by deflecting a charged particle beam onto a target object by a deflector configured to deflect the charged particle beam based on a deflection signal from a DAC (digital/analog converter) amplifier in which a settling time of the DAC amplifier is set to a first time to be a sufficient settling time for the deflection movement amount to evaluate the settling time of the DAC amplifier;
writing a plurality of second patterns, in a manner where each corresponding second pattern of the plurality of second patterns corresponding to each of the plurality of first patterns is in a position adjacent to a corresponding one of the plurality of first patterns, by deflecting a charged particle beam onto the target object respectively by the deflector for each second time of a plurality of different second times set as variable while setting the settling time of the DAC amplifier as variable using the plurality of different second times containing the sufficient settling time for the deflection movement amount;
measuring a width dimension of each of a plurality of combined patterns after adjacent ones of the plurality of first patterns and the plurality of second patterns are combined for the each second time set as variable; and
acquiring the settling time of the DAC amplifier needed for deflection by the deflection movement amount, using the width dimension of each of the plurality of the combined patterns measured.

2. The method according to claim 1, wherein a dimension between respective outer edges of the adjacent ones of the plurality of first patterns and the plurality of second patterns is used as the width dimension of each of the plurality of combined patterns.

3. The method according to claim 1, wherein a second time of the plurality of different second times set as variable, in which a combined pattern of the plurality of combined patterns whose a width dimension falls within an allowable error range of a width dimension of a combined pattern by first and second patterns deflected in the sufficient settling time both as the first and second times for the deflection movement amount is obtained, is acquired as the settling time.

4. The method according to claim 1, wherein the adjacent ones of the plurality of first patterns and the plurality of second patterns are line patterns.

5. The method according to claim 1, wherein the width dimension of the combined pattern is measured by a dimension measuring device.

6. The method according to claim 1, wherein one of the plurality of combined patterns includes one of the plurality of first patterns and one of the plurality of second patterns which are adjacent and in contact with each other.

7. The method according to claim 1, wherein one of the plurality of combined patterns includes one of the plurality of first patterns and one of the plurality of second patterns which are adjacent allowing a space therebetween.

8. The method according to claim 1, further comprising setting the sufficient settling time for the deflection movement amount to evaluate the settling time of the DAC amplifier before the plurality of first patterns is written.

9. The method according to claim 8, wherein when the plurality of second patterns is written, a second time of the plurality of different second times is set to one of the sufficient settling time and a plurality of different times shorter than the sufficient settling time.

10. The method according to claim 9, wherein the writing of the plurality of second patterns includes:
   setting the settling time of the DAC amplifier to the second time; and
   writing one of the plurality of second patterns by deflecting the charged particle beam onto the target object by the deflector in the second time set,
   wherein the setting the second time and the writing one of the plurality of second patterns are repeated while making the second time variable.

11. The method according to claim 1, wherein the target object has a resist film formed on a surface thereof,
   further comprising developing the target object after the plurality of first patterns and the plurality of second patterns are written.

12. The method according to claim 11, wherein a width dimension of a resist pattern formed by the developing is measured as the width dimension of the combined pattern.

13. The method according to claim 1, wherein the target object has a resist film formed on a surface thereof and a lower film formed below the resist film, further comprising:
   developing the target object after the plurality of first patterns and the plurality of second patterns are written; and
   etching the lower film using a resist pattern formed by the developing as a mask.

14. The method according to claim 13, wherein a width dimension of the lower film formed by the etching is measured as the width dimension of the combined pattern.

15. The method according to claim 1, wherein
   a pattern writing region of the target object is virtually divided into a plurality of stripe regions in a thin rectangular shape,
   the plurality of first patterns is respectively written into different stripe regions, and
   the plurality of second patterns is respectively written into different stripe regions for every second time set as variable.

16. The method according to claim 1, wherein
   a pattern writing region of the target object is virtually divided into a plurality of stripe regions in a thin rectangular shape,
   the plurality of stripe regions is respectively divided into a plurality of small regions in a mesh shape,
   the plurality of first patterns is written into a same small region of the plurality of small regions, and
   the plurality of second patterns is written into the same small region.

* * * * *